United States Patent [19]

Köhler

[11] Patent Number: 4,712,105

[45] Date of Patent: Dec. 8, 1987

[54] REMOTE CONTROL HAND APPARATUS FOR OPERATING DIFFERENT MODULES

[75] Inventor: Hans E. P. Köhler, Eindhoven, Netherlands

[73] Assignee: U.S. Philips Corporation, New York, N.Y.

[21] Appl. No.: 729,008

[22] Filed: Apr. 30, 1985

[30] Foreign Application Priority Data

Mar. 12, 1985 [NL] Netherlands ............... 8500690

[51] Int. Cl.[4] ............................................. H04Q 1/00
[52] U.S. Cl. ............................ 340/825.69; 340/365 S; 340/825.72; 358/194.1
[58] Field of Search ............... 358/194.1; 340/365 R, 340/365 VL, 365 S, 825, 825.69, 825.72, 765, 711, 712; 455/603

[56] References Cited

U.S. PATENT DOCUMENTS

| | | | |
|---|---|---|---|
| 3,807,831 | 4/1974 | Soref | 340/765 X |
| 3,956,745 | 5/1976 | Ellis | 340/365 S |
| 4,386,436 | 5/1983 | Kocher et al. | 358/194.1 X |
| 4,431,988 | 2/1984 | Molusis et al. | 340/712 |
| 4,551,717 | 11/1985 | Dreher | 340/365 VL X |
| 4,623,887 | 11/1986 | Welles, II | 340/825.69 X |

Primary Examiner—Ulysses Weldon
Attorney, Agent, or Firm—Robert T. Mayer; Bernard Franzblau

[57] ABSTRACT

Remote control hand apparatus for operating different modules such as a TV-receiver, teletext decoder, video recorder, VLP player, audio system, audio tuner, compact disc player, audio recorder, etc. This hand apparatus has a plurality of module keys by means of which the user can get access to a specific module. In addition, a dot-matrix display element is provided around which a plurality of multi-functional keys are arranged. The control function of such a key depends on the module key operated and this function is shown on the display-element for each of these keys.

5 Claims, 13 Drawing Figures

REMOTE CONTROL HAND APPARATUS FOR OPERATING DIFFERENT MODULES

BACKGROUND OF THE INVENTION

1. Field of the invention

The invention relates to a remote control hand apparatus for controlling several functions of one or more modules which to that end are coupled to this hand apparatus via a transmission means (wireless or wired). Said modules may consist of a TV receiver, a video recorder, a teletext decoder, an audio amplifier, an audio tuner, a compact disc player etc., but alternatively a door, a lighting system etc.

2. Description of the Prior Art

As is generally known, such a hand apparatus has a plurality of control keys forming the operable portions of switches which are usually arranged in a matrix structure and connected to a control circuit which determines whether a key has been pushed and which one. It then produces a group of pulses which are characteristic of the relevant key and are applied to a transmitter circuit. In said transmitter circuit this group of pulses is modulated on an appropriately chosen carrier signal, (preferably an infrared signal) and thereafter transmitted to the, or one of the modules, preferably via a wireless transmission channel.

To provide a distinction between the different types of modules, the hand apparatus may be provided with a separate set of control keys for each module. Apart from the fact that the hand apparatus would then become impermissibly large, it would also become very expensive because of the large number of keys. To obviate these disadvantages, European Patent Application No. 0120345 discloses a hand apparatus comprising only a limited number of keys, but with which all the functions of a plurality of modules can still be controlled. For that purpose this hand apparatus can be set to a plurality of modes, for example a selection mode and a plurality of module means. In the selection mode one module is assigned to each key or to a number of keys, that is to say that if now a given key is operated, the hand apparatus is adjusted to a module mode and the user accesses that module (for example the TV-receiver) assigned to the operated key. In this module mode the several keys are given control functions which are typical for the control of that module. The function a predetermined key can control consequently differs from module-mode to module-mode. Consequently, the keys of this prior art hand apparatus are multifunctional. To inform the user which function is assigned to which key at a given instant, each key is assigned a key display element on which the actual control function of the key is displayed, for example in the form of a symbol. To achieve all of this, this prior art hand apparatus comprises a control circuit in the form of a microcomputer to which both the keys and the key display elements are coupled. With this microcomputer it is also possible to control a further display for displaying certain informative texts. Therefore, this last mentioned display will be referred to as the information display.

This prior art hand apparatus has indeed a particularly conveniently arranged control panel, but the key display elements are required to be of a large size such that the actual control function can be shown clearly enough. Furthermore, the additional information display, and also all of the display driver circuits, require a considerable amount of space so that in practice this hand apparatus would become impermissibly large. In order to keep the dimensions of this hand apparatus sufficiently small the number of control keys is greatly limited. The result thereof is that several functions can only be controlled after a number of other keys have been operated. Thus, when the hand apparatus is in one module it must, for example, be first adjusted to the selection mode before the user can get access to another module.

OBJECT AND SUMMARY OF THE INVENTION

An object of the invention is to provide a hand apparatus of very limited size, which has a particularly conveniently arranged control panel, each module being accessible by a single keystroke.

According to the invention, this hand apparatus comprises a plurality of module keys to each of which a module is assigned and with which the user can only gain access to the relevant module; one single display element of the dot-matrix type around which the multi-functional control keys are arranged and on which, under the control of a control circuit, the actual control functions which are associated with the module to be operated and are assigned to these multi-functional keys are displayed.

DESCRIPTION OF A PREFERRED EMBODIMENT

Figure 1:
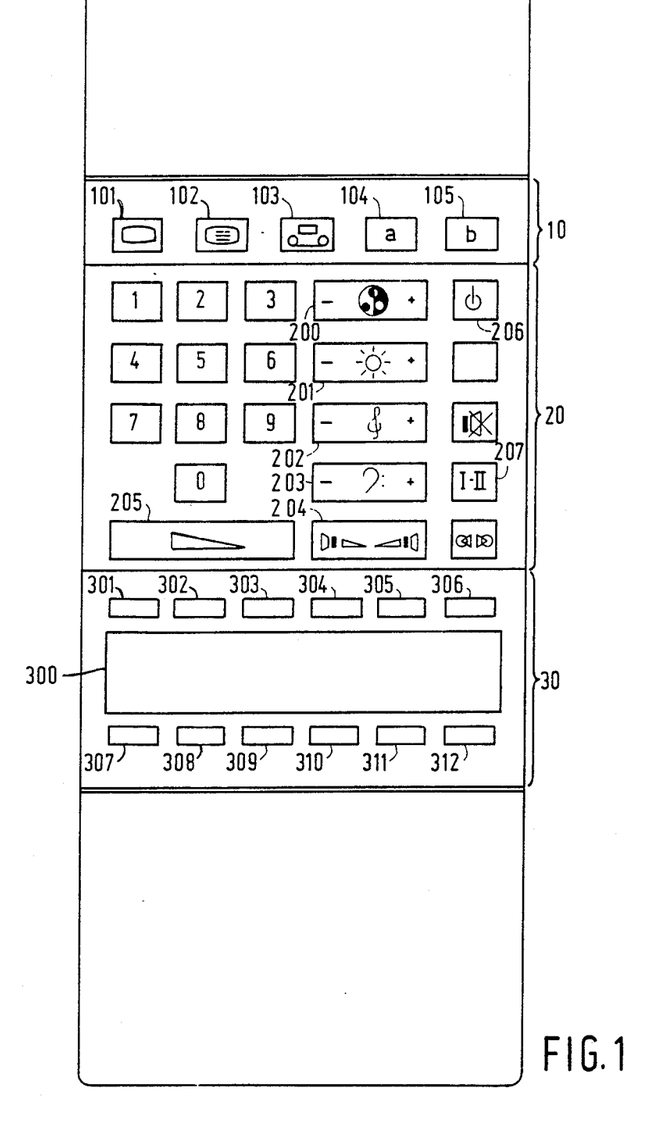
FIG. 1 shows the general structure of the remote control hand apparatus.

FIG. 1 shows the plan view of a remote control hand apparatus. The upper surface is divided into three sections, denoted by 10, 20 and 30, respectively. The section 10 is the module section and in this case comprises five module keys 101, 102, 103, 104 and 105. A symbol on each module key indicates to which module access is obtained if the relevant key is depressed. In the Figure these modules are a TV-receiver, a teletext decoder, a video recorder, a module a, not further specified and a module b, not further specified, respectively.

The section 20 comprises generally known and customary control keys, such as: the ten figure keys bearing the FIGS. 0 to 9, inclusive, a contrast key 200, a brightness key 201, a treble control key 202, a base control key 203, a balance key 204, a volume key 205, a key 206 for adjusting a module to the stand-by condition and a key 207 which enables a selection of either the one or the other language of a dual-language TV program.

The section 30 comprises a dot-matrix display 300 and a number of functional keys 301 to 306 and 308 to 312, arranged around the display.

Figure 2:
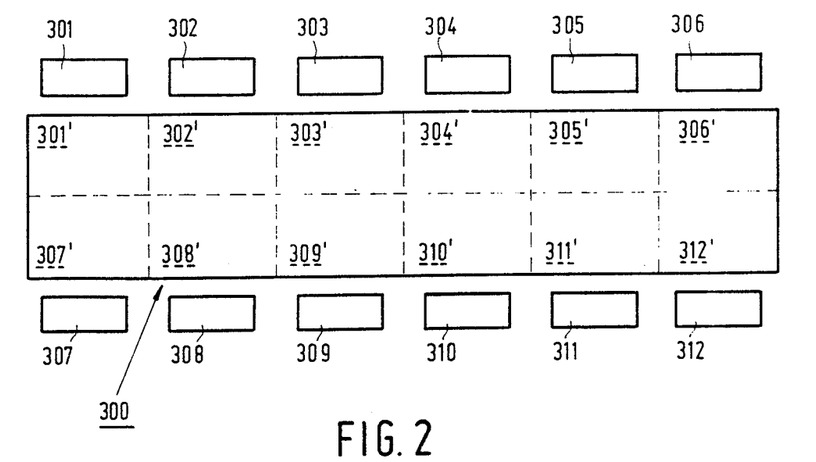
FIG. 2 shows the schematic division of the display into display fields.

These keys can be given functions which are specific to a given module. The control function assigned to a given multi-functional key is displayed on that part of the display 300 that borders on the relevant key. For that purpose the display can be fictitiously divided into twelve display fields, as shown schematically in FIG. 2 by 301'-312', respectively. The display field 301' is assigned to the multifunctional key 301, that is to say, the control function shown in display field 301' is presented when the key 301 is depressed. The same holds for display field 302' and key 302 etc. In a practical embodiment the symbol of the instantaneous operable module is displayed in the display field 307'.

Figure 3:
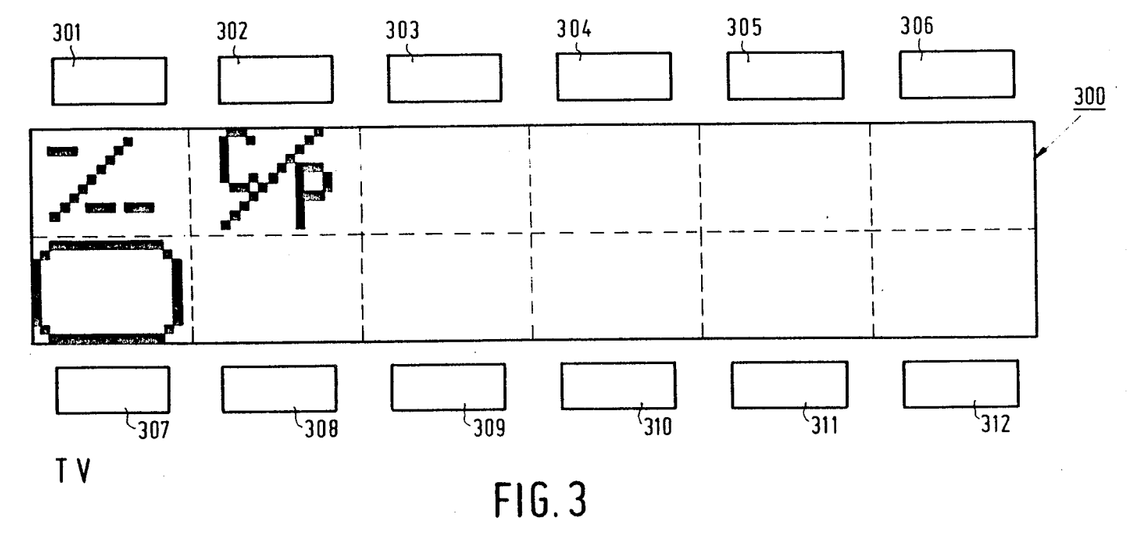
FIGS. 3 to 5 illustrate a number of possible displays.

As has already been remarked in the foregoing, the control functions displayed on the display are characteristic of the module to be operated and are consequently dependent on the module key which has been depressed. If, more specifically the TV key 101 is depressed, then the display shows, for example, the symbols of FIG. 3. By means of key 302 it is now possible to indicate whether a channel number (C) or a program number (P) will be given. By means of key 301 it is possible to indicate whether the channel or program number, as the case may be, is formed by one or two figures. In all other respects the TV-receiver is operated with the aid of the keys in section 20.

Figure 4:
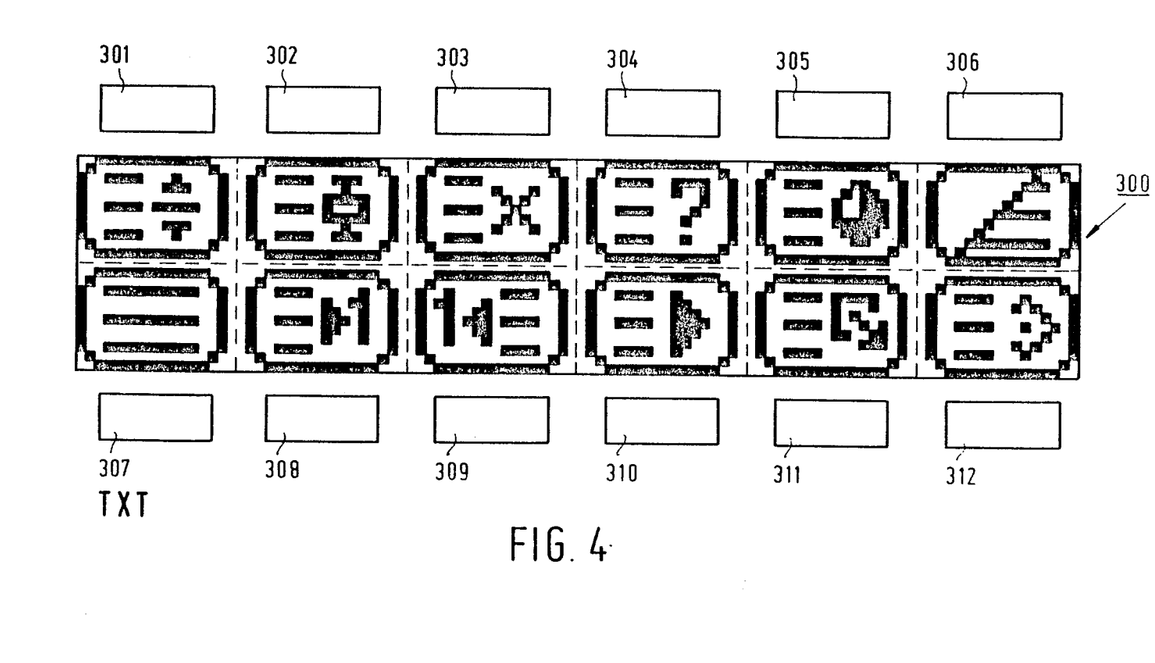

If after a predetermined channel or program has been selected, teletext key 102 is depressed, then, for example, the symbols shown in FIG. 4 are shown on the display 300, thus indicating the control functions assigned to the multi-functional keys 301–306 and 308–312.

Figure 5:
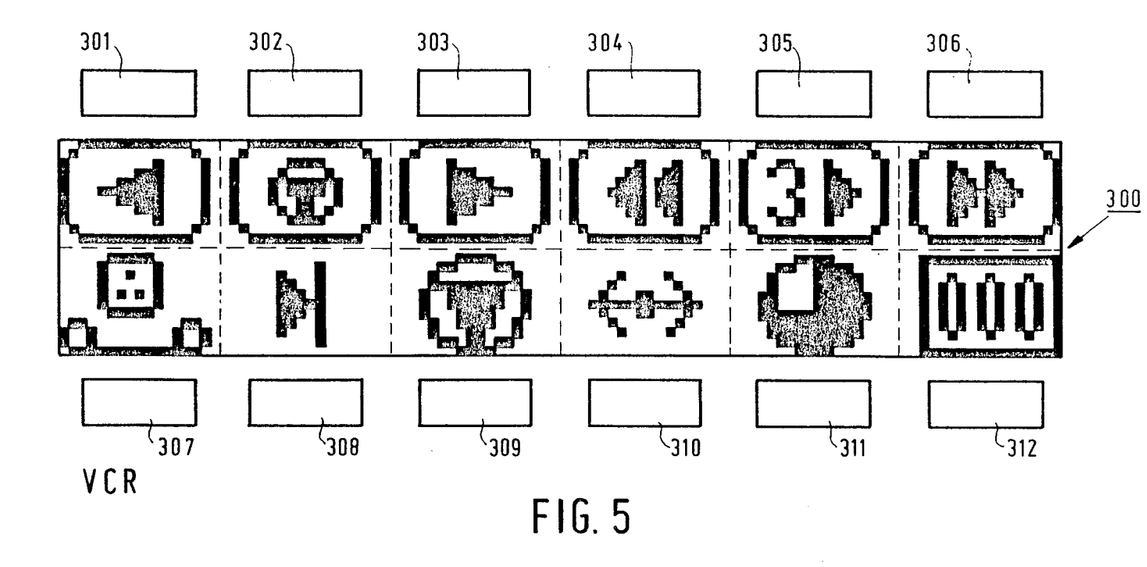

If, finally, the VCR-key 103 is depressed, then, for example, the symbols shown in FIG. 5 are displayed on the display 300.

Figure 6:
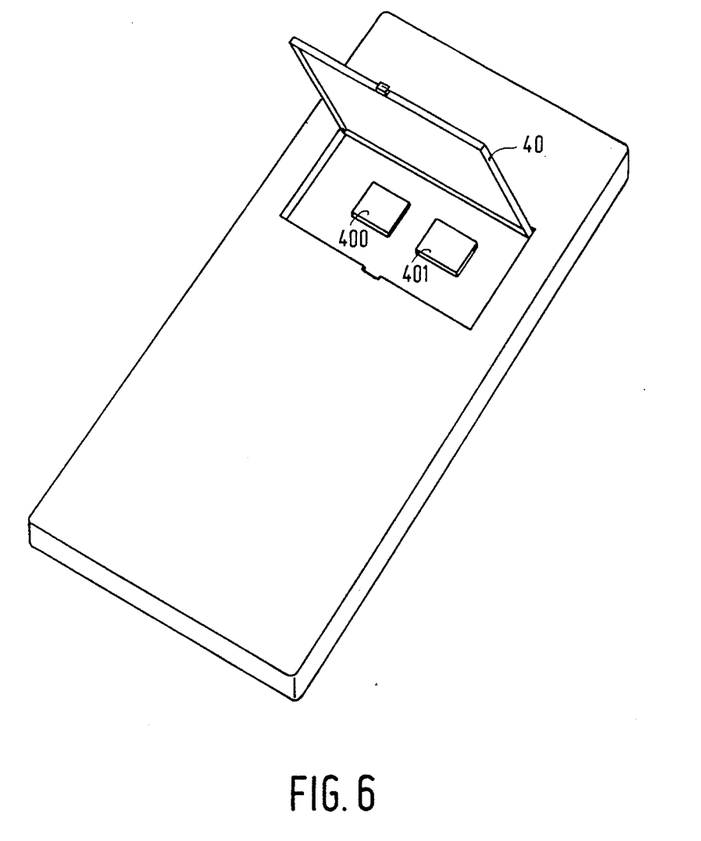
FIG. 6 shows a possible construction of the rear of the hand apparatus.
Figure 7:
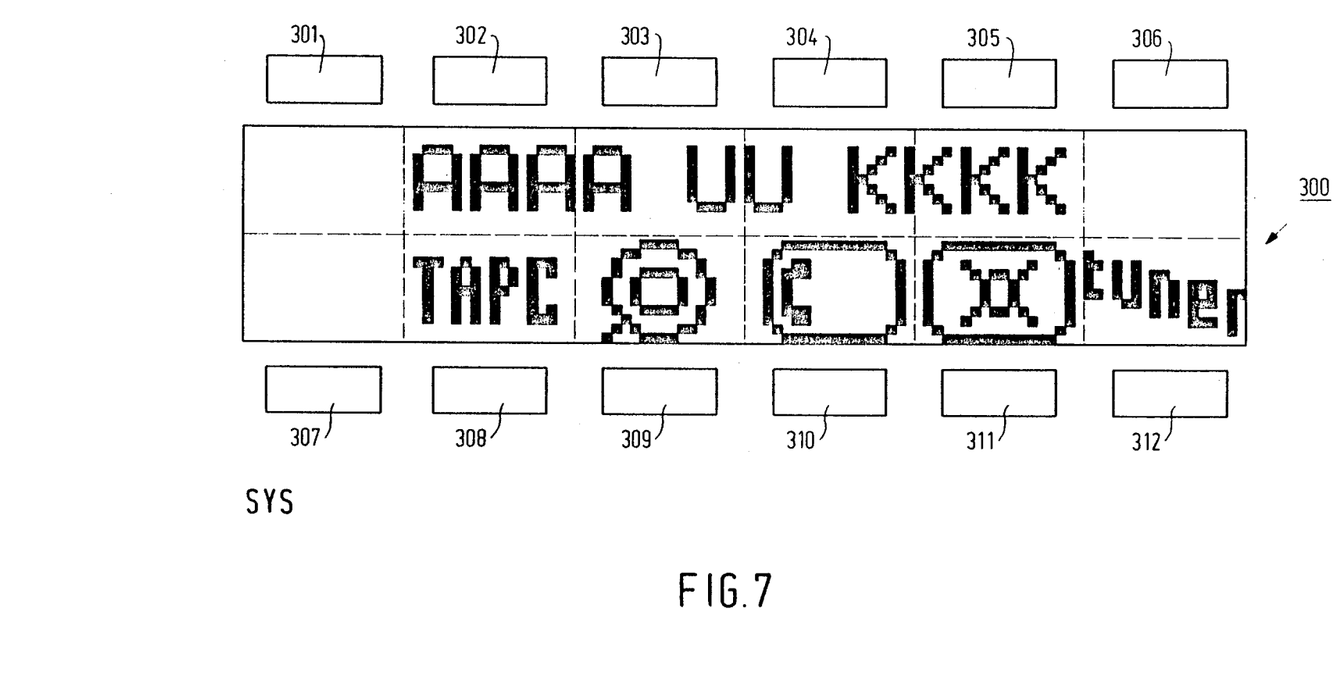
FIGS. 7 to 12 illustrate a number of possible displays.
Figure 8:
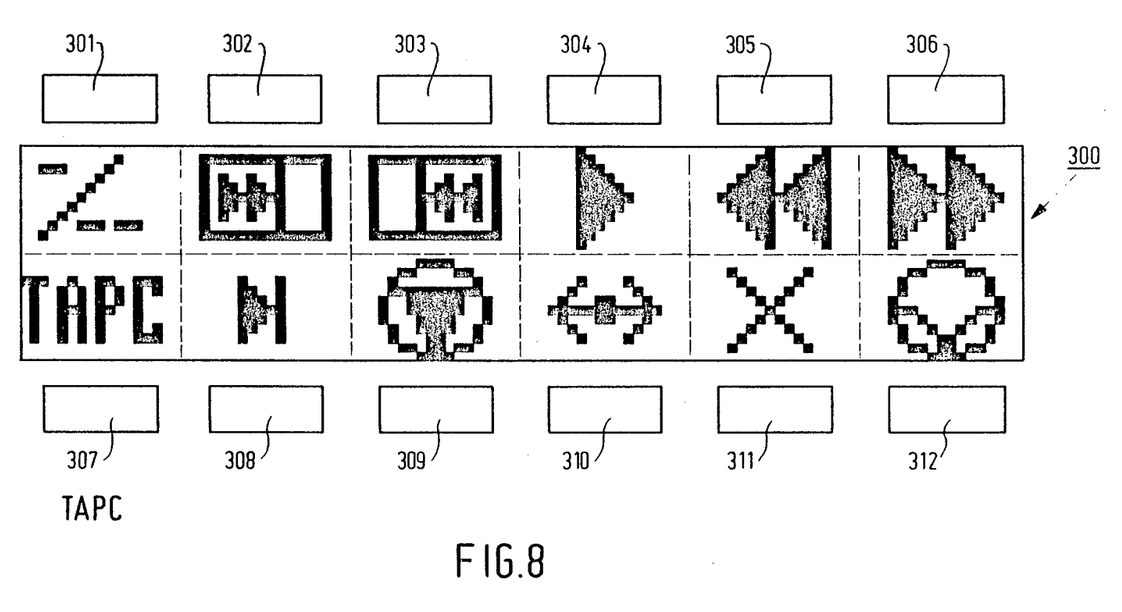
Figure 9:
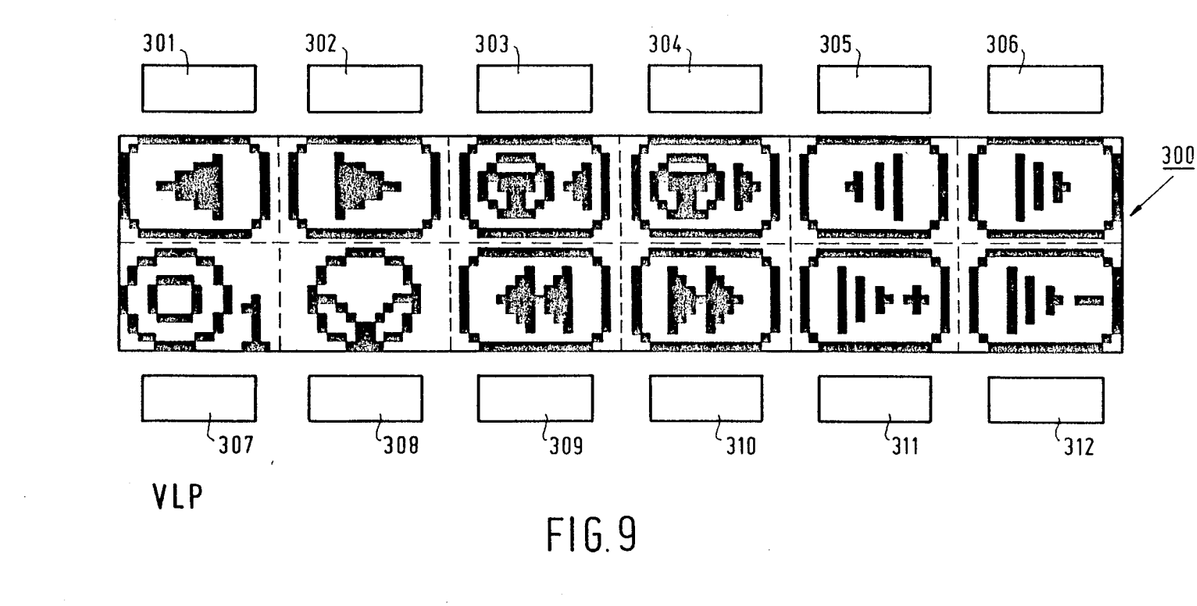
Figure 10:
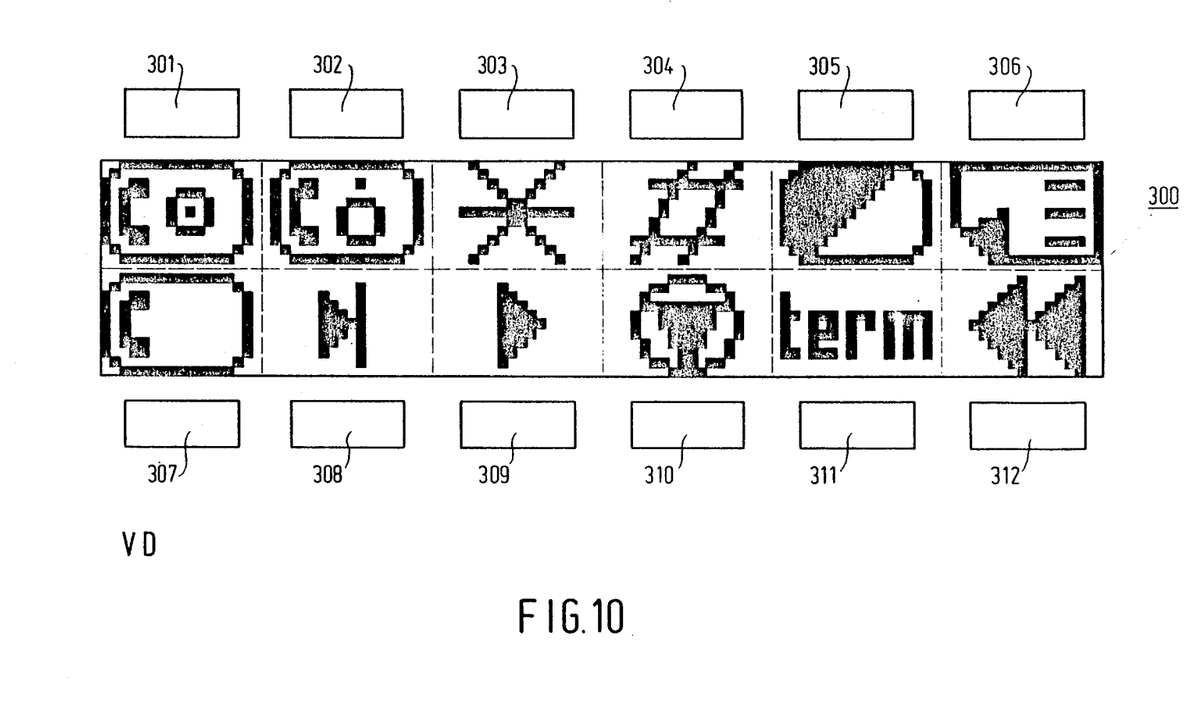
Figure 11:
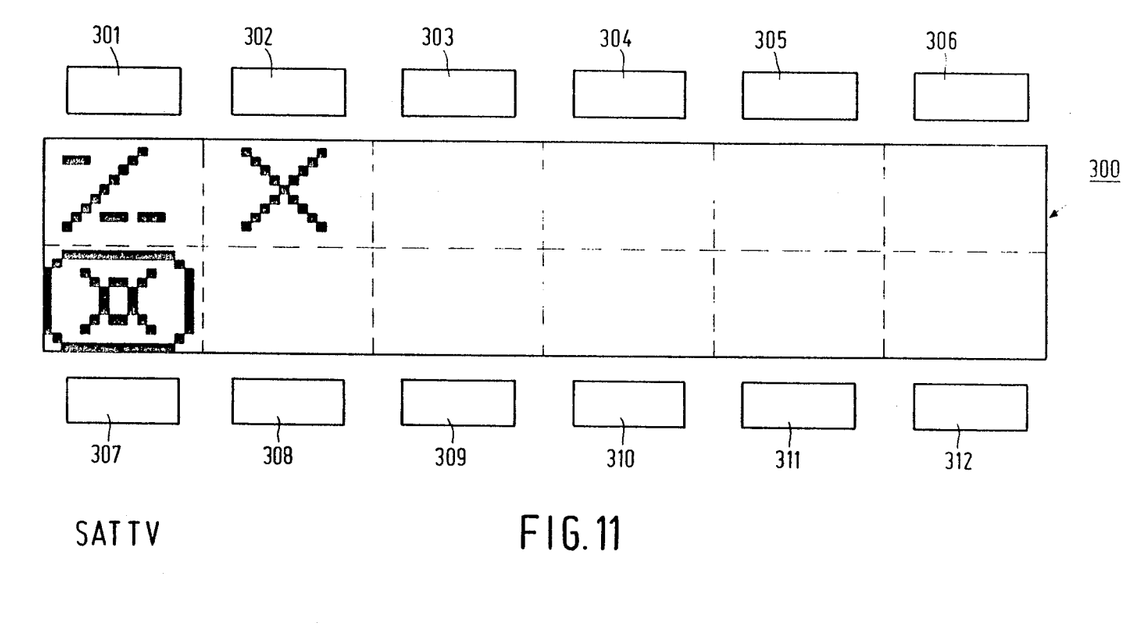
Figure 12:
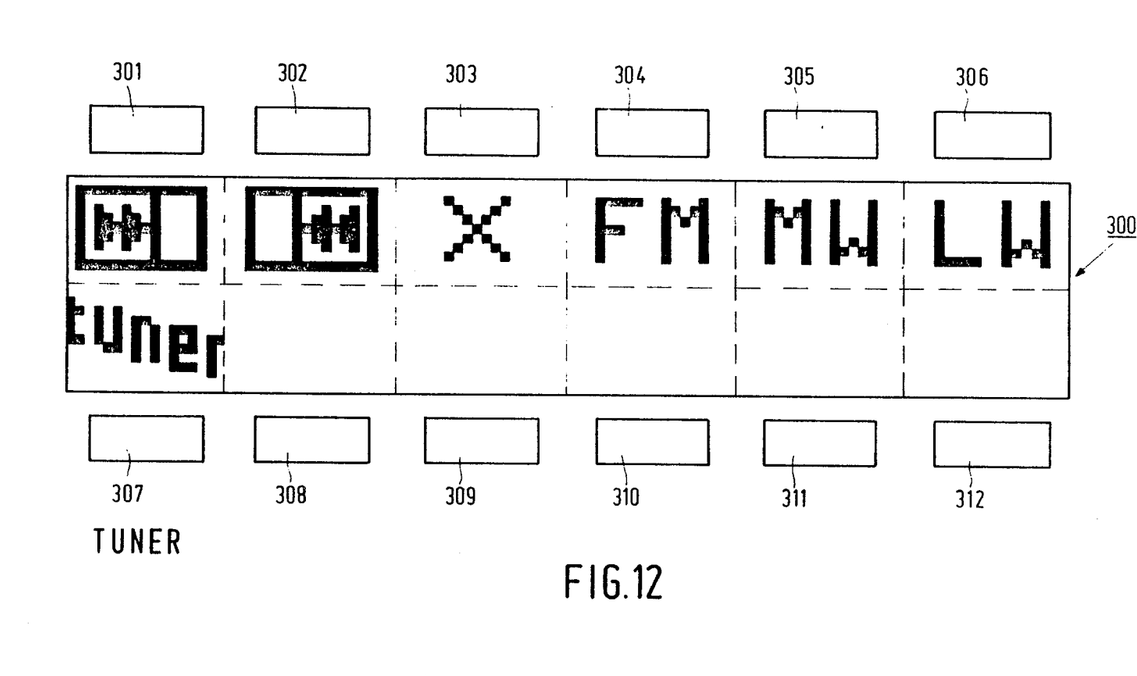

The module keys 104 and 105 are programmable, that is to say that a module can optionally be assigned to each of these keys. For example one of the following modules: an audio system, a VLP-system, a view data decoder, a satellite decoder, an audio tuner etc. To enable programming of these two module keys, the rear of the hand apparatus comprises, for example as shown in FIG. 6 under a cover 40 a programming key 400 and a storage key 401. If now the programming key 401 is depressed first, then the hand apparatus is set to the programming mode and in the upper half of the display there appears, for example, the text "make your choice" and at the lower half the symbols of the modules from which a selection can be made appear (see FIG. 7). If now one of the keys 308, 309, ... 312 is depressed, a text appears on the display, for example "push key a or b". If this instruction has been performed, a new text appears, for example "depress store key". If this instruction is carried out, then one of the sequences of symbols shown in the FIGS. 8 to 12 are displayed on the display and the programming mode has ended. More specifically, the FIGS. 8–12 show the control functions of an audio system, a VLP system, a view data decoder, a satellite decoder and an audio tuner, respectively.

It should be noted that the number of keys controlling one specific module may exceed the above-mentioned number of three keys. Also the number of modules from which a selection can be made for programming the keys a and b may be larger. Thus, the number of modules might, for example, be extended by a compact disc player, a TV camera, a system for illuminating the living room etc.

These separate module keys have the advantage that it is continuously possible to get access to the desired module by depressing a key only once.

Figure 13:
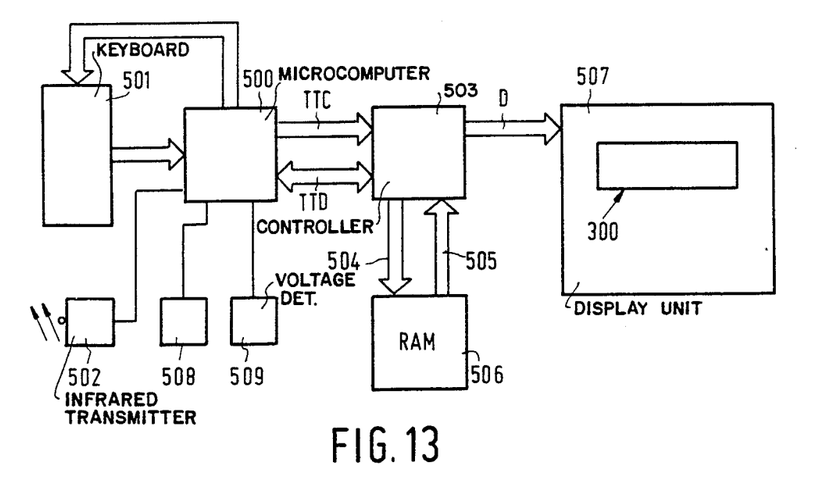
FIG. 13 shows a circuit diagram for generating the several control signals and for controlling the display.

A circuit enabling the above-described operation of the hand apparatus is shown in FIG. 13. This circuit comprises a microcomputer 500; for example the 80C49. This computer scans the key board 501 and also applies a control signal, which depends on the key operated, to an infrared end stage 502. It also applies data and timing signals via respective lines TTD and lines TTC to what is commonly referred to as a controller 503 for which, for example, the HD61830 may be used. This controller 503 is connected via two parallel busses 504 and 505 to a storage means 506, and via a bus D also to the column drivers and the line drivers of the dot-matrix display unit 507.

The programs required for the control of this circuit are known per se to a person skilled in the art and are stored in the internal program store of the microcomputer.

The symbols shown in the FIGS. 3, 4, 5, 7–12 are stored in the storage means 506, whereas the text appearing on the display after depressing the programming key is generated by the character generator of the controller 503.

In addition, the circuit shown in FIG. 13 comprises an arrangement 508 which is also connected to the microcomputer and produces an acoustic signal, when the hand apparatus is in the programming mode, each time an action different from the one displayed on the display is performed.

A voltage detector 509 can also be connected to the microcomputer. The voltage detector measures the battery voltage and, if this battery voltage has fallen below a predetermined threshold value regularly applies a signal to the microcomputer in response to which the controller 503 causes a text to appear on the display, thus informing the user of that fact.

In the foregoing it was assumed that for all possible modules the storage means contains the symbols of the associated control functions. It is, however, alternatively possible to couple a read arrangement to the microcomputer such that software applied via an external carrier (for example a magnetic card) can be stored in this storage means 506 by electronic means. Such a carrier might contain the information required for the operation of a predetermined module. This information is stored in the storage medium with the aid of the microcomputer, while the carrier itself is supplied with the module.

What is claimed is:

1. A remote control hand apparatus for generating control signals for controlling several functions of a plurality of modules coupled to the hand apparatus via a transmission channel, said hand apparatus comprising, a plurality of multi-functional keys to which one of a plurality of control functions is selectively assignable and of which the control function operable thereby is dependent on the module to be operated; a plurality of module keys each of which is assigned to a module; display means; a control circuit coupled to said module keys and to said multi-functional keys, said control circuit selecting, in dependence on the module to be operated, one of the assignable control functions for assigning a specific function to the multi-functional key and for displaying said operating function on the display means, characterized in that a user can only gain access to a relevant module via said plurality of module keys and the control circuit; that the display means comprise one single display device of the dot-matrix type around which all of the multi-functional keys are arranged in registry with adjacent portions of the display device assigned to respective ones of the multi-functional keys and on which display device a plurality of symbols indicating the actual control functions associated with the module selected to be operated and assigned to the multi-functional keys are simultaneously displayed for all of the specific control functions assigned to their respective adjacent multi-functional keys upon actuation of a particular module key and under the control of the control circuit.

2. A remote control hand apparatus as claimed in claim 1, characterized in that informative information also can be displayed on the display device under the control of the control circuit.

3. A remote control hand apparatus for operating a plurality of different remotely located modules under control of a control circuit and via a signal transmission path, said apparatus comprising: a plurality of module keys for selectively gaining access to a module to be selected, a plurality of multi-functional keys which provide a plurality of control functions related to said different modules wherein a selected control function is determined by the module selected by an operated module key, and a single display apparatus of the dot-matrix type, means for coupling said control circuit to said module keys and to said multi-functional keys so that, depending on the module selected by a module key, a specific one of said plurality of control functions is assigned to a multi-functional key, said control circuit being the operative means by which a selected module key provides access to the selected module, and wherein said multi-functional keys are physically arranged around the display apparatus and in a line along at least one edge of the display apparatus so that adjacent portions of the display apparatus simultaneously display, under control of the control circuit, symbols indicative of all of the specific control functions related to the selected module and assigned to their respective adjacent multi-functional keys.

4. A remote control hand apparatus as claimed in claim 3 wherein, after a given remote module has been selected, the control circuit includes means for providing direct access to another remote module by actuation of only the one module key assigned to said another remote module.

5. A remote control hand apparatus as claimed in claim 1 further comprising a single housing which contains all of said multi-functional keys, all of said module keys, said control circuit, said one display device and a plurality of control keys.

* * * * *